US006330143B1

United States Patent
Maly et al.

(10) Patent No.: US 6,330,143 B1
(45) Date of Patent: Dec. 11, 2001

(54) AUTOMATIC OVER-CURRENT PROTECTION OF TRANSISTORS

(75) Inventors: Douglas Keith Maly, Dearborn; Chingchi Chen, Ann Arbor, both of MI (US)

(73) Assignees: Ford Global Technologies, Inc.; Ecostar Electric Drive Systems LLC, both of Dearborn, MI (US)

( * ) Notice: Subject to any disclaimer, the term of this patent is extended or adjusted under 35 U.S.C. 154(b) by 0 days.

(21) Appl. No.: 09/512,480

(22) Filed: Feb. 23, 2000

(51) Int. Cl.[7] .................................................. H02H 3/18
(52) U.S. Cl. ............................................. 361/101; 361/86
(58) Field of Search .................................. 361/87, 79, 86, 361/93.1, 100–101

(56) References Cited

U.S. PATENT DOCUMENTS

| | | |
|---|---|---|
| 3,931,567 | 1/1976 | Kostecki . |
| 4,034,280 | 7/1977 | Cronin et al. . |
| 4,278,930 | 7/1981 | Rogers . |
| 4,338,646 | 7/1982 | Davis et al. . |
| 4,428,015 | 1/1984 | Nesler . |
| 4,525,765 | 6/1985 | Brajder . |
| 4,538,198 | 8/1985 | Imanishi et al. . |
| 4,651,252 | 3/1987 | Babinski . |
| 4,771,357 | * 9/1988 | Lorincz et al. .................... 361/87 |
| 4,862,018 | 8/1989 | Taylor et al. . |
| 4,893,158 | 1/1990 | Mihara et al. . |
| 5,325,258 | * 6/1994 | Choi et al. ....................... 361/87 |
| 5,563,759 | 10/1996 | Nadd . |
| 6,097,582 | * 8/2000 | John et al. ....................... 361/79 |

* cited by examiner

Primary Examiner—Michael J. Sherry
(74) Attorney, Agent, or Firm—Mark L. Mollon; William J. Coughlin

(57) ABSTRACT

The present invention discloses a circuit and method for detecting a fault current in a circuit containing a power transistor. A comparator in communication with a parasitic inductance is utilized to sense the excessive change in current through the power transistor. When the voltage magnitude through the parasitic inductor exceeds a predefined limit, the comparator triggers a gate drive circuit. The gate drive circuit is in communication with the power transistor. The gate drive circuit shuts off the power transistor when the predefined limit is reached. Thus, the present invention is capable of reacting quickly to fault currents through the power transistor thereby protecting the transistor and other circuit components from damage.

6 Claims, 1 Drawing Sheet

AUTOMATIC OVER-CURRENT PROTECTION OF TRANSISTORS

TECHNICAL FIELD

The present invention relates to power transistors and methods and circuits for protecting such transistors from damage due to fault currents.

BACKGROUND ART

Currently, there exists numerous converters which utilize power transistors. One application of power transistors is in conventional power supplies. In a power supply, the power transistors are used to switch high voltages. Such converters which utilize power transistors may be subjected to fault currents. A fault current through the power transistor causes serious damage to the power transistor as well as other components of the converter. These fault currents may be a product of short circuits or current shoot-through.

The prior art has responded to the above-referenced problems by offering complex protection circuits having multiple circuit devices. Such circuits include delay protection circuits for current shoot-through, and protection circuits for short circuits. The addition of the referenced protection circuits are not only in many instances slow to react to a detected fault current but are also costly to implement. One common scheme, desat protection, must be disabled during and shortly after switching times. Another common scheme, phase current protection, does not measure device current and thus cannot protect against shoot-through.

As such, a need exists for a new and improved protection circuit for a power transistor. The new and improved protection circuit must be capable of reacting quickly to a fault current, and must contain minimal additional components such that the protection circuit is low in cost without compromising reliability.

DISCLOSURE OF INVENTION

Accordingly, an object of the present invention is to provide a method and circuit for detecting fault currents through a power transistor circuit and providing a signal to shut down the power transistor.

In accordance with this and other objects, the present invention provides a circuit and method for detecting a fault current through a power transistor. A power transistor's inherent parasitic inductance is utilized to sense a change in current through the power transistor. When the voltage across the parasitic inductor exceeds a predefined limit a comparator circuit triggers a gate drive circuit. The comparator circuit causes the gate drive circuit to switch off the power transistor. Thus, the present invention is capable of reacting quickly to fault currents through the power transistor, thereby protecting the transistor and other circuit components from damage.

Thus, in accordance with one aspect of the present invention, a protection circuit is provided for protecting a power transistor from damage by sensing a change in current though the power transistor. The circuit includes a parasitic inductance inherent to the power transistor. A voltage is generated across the parasitic inductance when a change in current occurs through the power transistor. The voltage varies proportionally with the change in current through the power transistor. A comparator in communication with the parasitic inductance and a gate drive circuit is utilized to trigger the gate drive circuit to shut down the power transistor when the voltage exceeds a predefined value. The present invention contains a minimal number of components, reacts quickly to prevent damage, and is relatively inexpensive.

In accordance with another aspect of the invention, a method is provided for protecting a power transistor from being damaged by sensing a change in current through the power transistor. The method comprises detecting a change in current through the power transistor by measuring a voltage on the existing power transistor terminals using a voltage measurement circuit and activating a gate drive circuit to shut down the power transistor when the voltage exceeds a predefined value. The method according to the present invention prevents a power transistor from being damaged by reacting quickly to a change in current through the power transistor wherein a large change in current is indicative of a circuit fault.

The above object and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
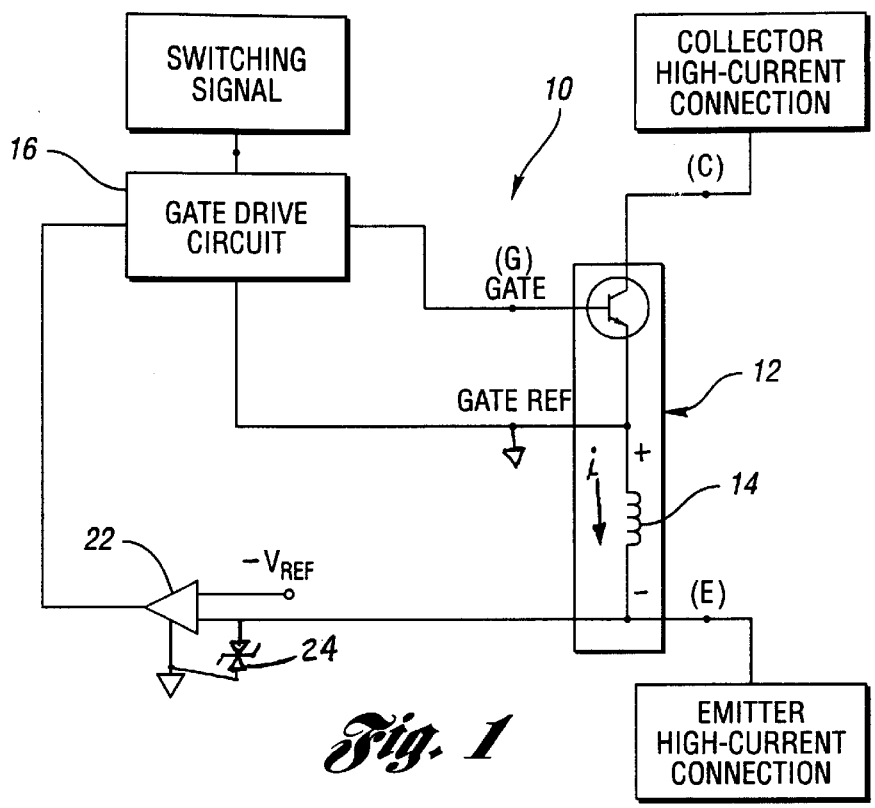
FIG. 1 is a circuit diagram illustrating a power transistor circuit having a gate drive circuit connected to the base of the power transistor, and a protection circuit connected to the gate drive circuit for protecting the power transistor from being damaged, according to the present invention.

Referring now to the drawings, FIG. 1 illustrates a circuit 10 used in a power supply or other device having power transistors. Circuit 10 includes a power transistor 12, a gate drive circuit 16, and a comparator 22. Power transistor 12 includes an inherent parasitic inductance inductor 14. Inductor 14 is in series with power transistor 12 and thus sees the same current as the power transistor.

Gate drive circuit 16 is a conventional gate drive circuit, as well known to individuals of ordinary skill in the art. Gate drive circuit 16 is connected to the gate of the power transistor 12 if the power transistor is an insulated gate bipolar transistor (IGBT) or the base of the power transistor if the power transistor is a BJT. In the case of IGBTs, conduction of power transistor 12 is controlled by the gate drive circuit 16 by providing a relatively low power supply to the gate of the power transistor which turns on the power transistor. Likewise, the gate drive circuit removes the power from the gate of the transistor to shut off conduction of the power transistor. In the case of BJTs, conduction of power transistor 12 is controlled by the gate drive circuit 16 by providing a current to the base of the power transistor which turns on the power transistor. Likewise, the gate drive circuit removes the current from the base of the transistor to shut off conduction of the power transistor.

The collector and emmitter of power transistor 12 are connected to a high current. The emitter connection provides access to one side of the inductance 14. An isolated low voltage is applied to the base (or gate) of the power transistor. The reference point for the base (or gate) voltage is commonly labeled "emmitter" but is a separate connector and provides access to the other side of the inductance 14.

The voltage across inductor 14 is governed by the equation:

$$V_L = L * (dI/dt)$$

where $V_L$ is the voltage across inductor 14, L is the inductance constant of inherent parasitic inductance 14, and dI/dt is the change in current through inductor 14. When a fault occurs in circuit 10 or in the circuit that circuit 10 is connected to, a large change in current (dI/dt) will occur through transistor 12 and of course through inherent inductance 14. The large change in current (dI/dt) will in turn create the voltage VL across the inductor 14. Voltage (VL) is compared against a reference voltage to determine if a fault current exists.

Possible faults include shoot-through and short circuits. Each of these faults creates a large change in current through inherent inductance 14. The large change in current immediately generates a significant voltage ($V_L$) across inductor 14.

Comparator 22 requires supporting circuitry as well known in the art such as, for example, a bipolar power supply (not shown). Further, a zener diode 24 is shown connected across the signal sense and ground terminals as shown in FIG. 1. The zener diode functions to protect the comparator 22 from an over-voltage. The comparator has a negative voltage reference typically equal to −2.5 volts since the comparator circuit connections to the parasitic inductor 14 will generate a negative voltage output signal to the comparator.

In one embodiment, the comparator 22 is configured to trigger the gate drive circuit 16 at a voltage of −2.5 volts when a large change in current occurs through the power transistor 12. For example, a fault current may have a value of 2,000 amps per microsecond to 50,000 amps per microsecond. Thus, when inductor 14 sees a change in current at this level, the voltage output signal will reach −2.5 volts which will trigger comparator 22. The comparator reaches the threshold voltage (−2.5 volts) early in the fault event, and the output of the comparator 22 will transition to a high voltage state early on and trigger the gate drive circuit 16 to safely shut down the power transistor 12. The present invention provides a robust protection circuit for a power transistor which is not adversely affected by temperature changes and parameter variations.

Figure 2:
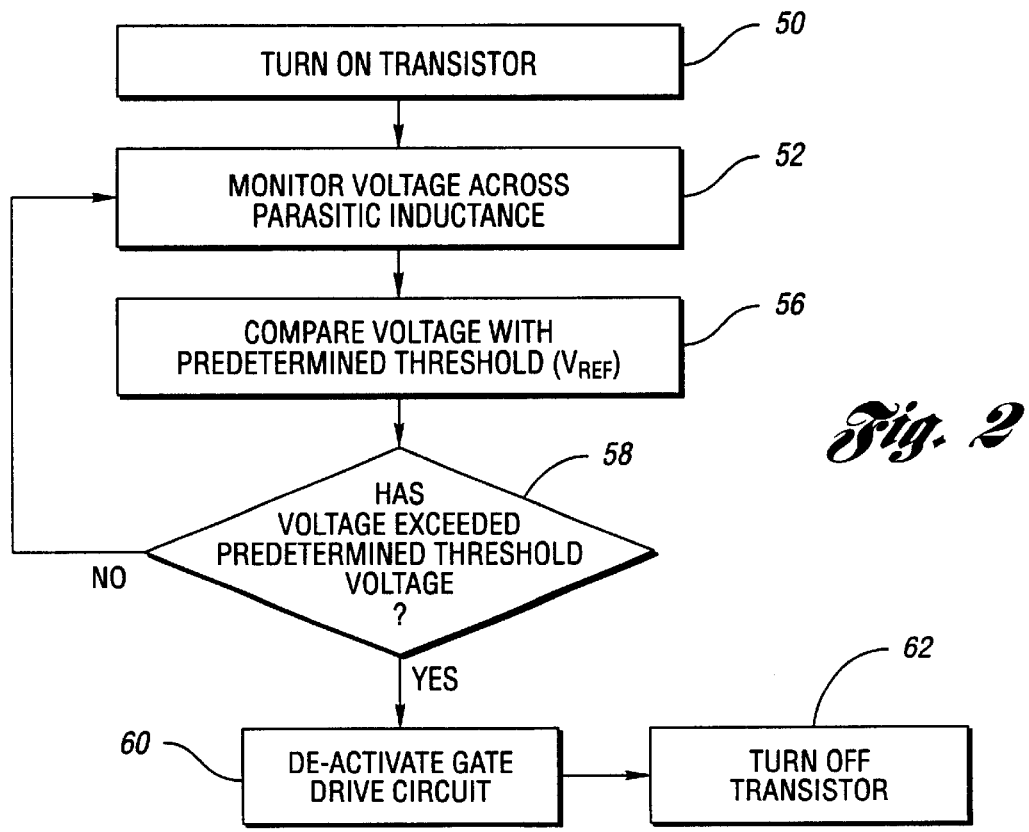
FIG. 2 is a flow diagram illustrating a method for protecting a power transistor from being damaged by sensing a change in current through the power transistor and activating a gate drive circuit to shut down the power transistor when a voltage across an inductor exceeds a predefined value, according to the present invention.

Reference is now made to FIG. 2, which illustrates a method for protecting a power transistor from being damaged by fault currents, according to the present invention. Gate drive circuit 16 applies a voltage to the base (or gate) of power transistor 12 to bias the power transistor 12 into conduction, as represented by block 50. Voltage across inherent inductance 14 indicates the change in current through transistor 12, as represented by block 52.

With continuing reference to FIG. 2, a method for protecting the power transistor from damage is further illustrated, according to the present invention. The voltage across inherent inductance 14 is compared to a predefined threshold voltage, as represented by block 56. The threshold voltage is selected based on the characteristics of a specific power transistor. In an embodiment of the present invention, the threshold voltage is the voltage required to trigger the comparator 22 at an early stage of a short circuit event. At block 58, the present invention determines whether the predefined threshold voltage has been exceeded. If the predefined threshold voltage has been exceeded, the comparator 22 will deactivate the gate drive circuit 16, as represented by block 60. At block 62, the transistor is turned off by the gate drive circuit 16 after receiving a high voltage signal from the comparator 22. However, if the voltage across the inherent inductance 14 does not exceed the threshold voltage in magnitude, the power transistor 12 will not be turned off, and the change in current through the transistor will continue to be monitored, as represented by block 52.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for protecting a power transistor from being damaged by a fault current, the method comprising:

providing an inductor in series with the power transistor;

detecting voltage generated by the inductor in response to a change in current through the power transistor and the inductor, wherein the inductor voltage varies proportionally to the change in current through the power transistor and the inductor; and shutting down conduction of the power transistor when the magnitude of the inductor voltage exceeds a threshold voltage value indicative of a fault current.

2. The method of claim 1 wherein the inductor is a parasitic inductance inductor inherent to the power transistor.

3. The method of claim 1 wherein shutting down conduction further comprises triggering a comparator to deactivate a gate drive circuit.

4. A circuit for protecting a power transistor from being damaged by a fault current, the circuit comprising:

an inductor in series with the power transistor, wherein the inductor generates a voltage in response to a change of current through the power transistor and the inductor, wherein the inductor voltage varies proportionally to the change in current through the power transistor and the inductor; and a comparator in communication with the inductor and the power transistor, wherein the comparator shuts down the power transistor when the magnitude of the inductor voltage exceeds a threshold voltage value indicative of a fault current.

5. The circuit of claim 4 wherein the inductor is a parasitic inductance inductor inherent to the power transistor.

6. The circuit of claim 4 further comprising a gate drive circuit which is triggered by the comparator to shut down the power transistor when the magnitude of the inductor voltage exceeds the threshold voltage value.

* * * * *